US009203347B2

United States Patent
Jiang et al.

(10) Patent No.: US 9,203,347 B2
(45) Date of Patent: Dec. 1, 2015

(54) ENVELOPE TRACKING APPARATUS AND METHOD

(71) Applicant: FutureWei Technologies, Inc., Plano, TX (US)

(72) Inventors: Hong Jiang, Kernersville, NC (US); Wael Al-Qaq, Oak Ridge, NC (US); Matthew Kostelnik, Louisville, NC (US)

(73) Assignee: Futurewei Technologies, Inc., Plano, TX (US)

( * ) Notice: Subject to any disclaimer, the term of this patent is extended or adjusted under 35 U.S.C. 154(b) by 10 days.

(21) Appl. No.: 14/184,397

(22) Filed: Feb. 19, 2014

(65) Prior Publication Data

US 2015/0236654 A1    Aug. 20, 2015

(51) Int. Cl.
*H03G 3/00* (2006.01)
*H03F 3/04* (2006.01)
*H03F 1/02* (2006.01)
*H03G 3/30* (2006.01)
*H03F 3/19* (2006.01)
*H03F 3/21* (2006.01)

(52) U.S. Cl.
CPC ............ *H03F 1/0233* (2013.01); *H03F 3/19* (2013.01); *H03F 3/21* (2013.01); *H03G 3/3036* (2013.01); *H03F 2200/171* (2013.01); *H03F 2200/451* (2013.01)

(58) Field of Classification Search
USPC ........................................ 330/297, 127, 136
IPC ..................................... H03G 3/00; H03F 3/04
See application file for complete search history.

(56) References Cited

U.S. PATENT DOCUMENTS 5,420,536 A      5/1995   Faulkner et al.
7,167,054 B1 *   1/2007   Dening et al. ................. 330/297
7,193,459 B1 *   3/2007   Epperson et al. .............. 330/130
7,852,150 B1 *  12/2010   Arknaes-Pedersen .......... 330/10

(Continued)

FOREIGN PATENT DOCUMENTS

CN         1805274 A      7/2006
KR     20120070143 A      6/2012

OTHER PUBLICATIONS

Hassan, M., et al., "High Efficiency Envelope Tracking Power Amplifier with Very Low Quiescent Power for 20 MHz LTE," Radio Frequency Integrated Circuits Symposium (RFIC), Jun. 5-7, 2011, 4 pages.
Kim, D., et al., "Wideband Envelope Tracking Power Amplifier for LTE Application," Radio Frequency Integrated Circuits Symposium (RFIC), Jun. 17-19, 2012, pp. 275-278.

(Continued)

*Primary Examiner* — Patricia T Nguyen
(74) *Attorney, Agent, or Firm* — Slater & Matsil, L.L.P.

(57) ABSTRACT

An apparatus comprises an amplifier having an input coupled to a radio frequency signal through a digital-to-analog circuit, an adaptive power supply having an output coupled to a bias voltage of the amplifier, wherein the output of the adaptive power supply is configured to have a shape similar to an envelope of the radio frequency signal and a feedback circuit comprising a sensing circuit and a mapping circuit, wherein the sensing circuit is configured to sense a current flowing from the adaptive power supply to the amplifier and sense the bias voltage of the amplifier, and wherein the mapping circuit is configured to sense the bias voltage of the amplifier, and wherein the mapping circuit is configured to generate a control signal for dynamically adjusting parameters of a low pass filter so as to stabilize the adaptive power supply.

20 Claims, 4 Drawing Sheets (56) References Cited

U.S. PATENT DOCUMENTS

| | | | |
|---|---|---|---|
| 8,139,792 B2* | 3/2012 | Magrath | 381/120 |
| 2002/0171484 A1 | 11/2002 | Sundstorm | |
| 2006/0186955 A1 | 8/2006 | Quilter | |
| 2007/0139105 A1* | 6/2007 | Kennan | 330/124 R |
| 2007/0200626 A1* | 8/2007 | Pedersen et al. | 330/251 |
| 2012/0194274 A1* | 8/2012 | Fowers et al. | 330/293 |
| 2014/0085008 A1* | 3/2014 | Cohen et al. | 330/297 |

OTHER PUBLICATIONS

International Search Report of Patent Cooperation Treaty (PCT), International Application No. PCT/CN2015/073041, Applicant Huawei Technologies Co., Ltd., date of mailing Apr. 29, 2015, 12 pages.

* cited by examiner

ENVELOPE TRACKING APPARATUS AND METHOD

TECHNICAL FIELD

The present invention relates to an envelope tracking apparatus, and more particularly, to an envelope tracking apparatus capable of dynamically adjusting control loop parameters so as to stabilize the control loop and improve the input-to-output response of the envelope tracking apparatus.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of standards such as the main $2^{nd}$-Generation (2G) technology Global System for Mobile Communications (GSM), the main $3^{rd}$-Generation (3G) technology Universal Mobile Telecommunications System (UMTS) and the main $4^{th}$-Generation (4G) technology Long Term Evolution (LTE).

A wireless network may include a wireless device and a plurality of base stations. The wireless device may be a notebook computer, a mobile phone or a Personal Digital Assistant (PDA), a media player, a gaming device or the like. The base stations communicate with the wireless device over a plurality of wireless channels coupled between the wireless device and the base stations (e.g., a downlink channel from a base station to a wireless device). The wireless device may send back information, including channel information, to the base stations over a plurality of feedback channels (e.g., an uplink channel from the wireless device to the base station).

The wireless device may comprise a transmitter and a receiver coupled between an antenna and a baseband processor. A digital signal generated by the baseband processor may be mapped onto a constellation plot through which the digital signal may be converted into an in-phase signal and a quadrature signal. Both the in-phase signal and the quadrature signal are converted by local oscillators to in-phase and quadrature components having a carrier frequency. The in-phase and quadrature components are summed together before being sent to an input of a power amplifier. The power amplifier is employed to amplify the input signal to a desired power level suitable for radio communication.

The power amplifier is an important component in a wireless network. High efficiency and high linearity power amplifiers are desirable in order to improve the performance of the wireless network.

Envelope tracking is an effective technique to improve the efficiency of a power amplifier. The power consumption of a power amplifier is proportional to the bias voltage level of the power amplifier. A lowered bias voltage, however, may cause the nonlinearity of the power amplifier, which degrades the output signal of the power amplifier. If the bias voltage of the power amplifier is modulated such that the bias voltage follows the envelope of the output signal of the power amplifier, the linear operation of the power amplifier can be maintained. Such a modulated bias voltage helps to reduce the average value of the bias voltage, thereby reducing the average power consumption of the power amplifier.

SUMMARY OF THE INVENTION

These and other problems are generally solved or circumvented, and technical advantages are generally achieved, by preferred embodiments of the present invention which provide a system, apparatus and method for stabilizing a control loop of an envelope tracking power amplifier.

In accordance with an embodiment, an apparatus comprises an amplifier having an input coupled to a radio frequency signal through a digital-to-analog circuit, an adaptive power supply having an output coupled to a bias voltage of the amplifier, wherein the output of the adaptive power supply is configured to have a shape similar to an envelope of the radio frequency signal and a feedback circuit comprising a sensing circuit and a mapping circuit, wherein the sensing circuit is configured to sense a current flowing from the adaptive power supply to the amplifier and sense the bias voltage of the amplifier, and wherein the mapping circuit is configured to sense the bias voltage of the amplifier, and wherein the mapping circuit is configured to generate a control signal for dynamically adjusting parameters of a low pass filter so as to stabilize the adaptive power supply.

In accordance with another embodiment, a system comprises an in-phase and quadrature signal generator configured to generate an in-phase signal and a quadrature signal, a first digital-to-analog converter having an input coupled to an output of the in-phase and quadrature signal generator, an envelope generator having an input coupled the output of the in-phase and quadrature signal generator, a second digital-to-analog converter having an input coupled to an output of the envelope generator and an envelope tracking modulator having an input coupled to an output of the second digital-to-analog converter.

The system further comprises an amplifier having an input coupled to an output of the first digital-to-analog converter and a bias voltage input coupled to an output of the envelope tracking modulator, wherein the envelope tracking modulator comprises an adaptive power supply having an output coupled to the bias voltage input of the amplifier, wherein the output of the adaptive power supply is configured to have a shape similar to an envelope of the in-phase signal and the quadrature signal and a feedback circuit comprising a sensing circuit and a mapping circuit, wherein the sensing circuit is configured to sense a current flowing from the adaptive power to the amplifier and sense the bias voltage of the amplifier; and wherein the mapping circuit is configured to adjust parameters of a low pass filter so as to stabilize the adaptive power supply.

In accordance with yet another embodiment, a method comprises providing a radio frequency signal to an amplifier, wherein the amplifier has a bias voltage input coupled to an output of an adaptive power supply, extracting an envelope of the radio frequency through an envelope generator, configuring the adaptive power supply such that the output of the adaptive power supply has a shape similar to the envelope of the radio frequency signal and adjusting parameters of a low pass filter based upon detected current and voltage signals of the amplifier through a feedback circuit comprising a sensing circuit and a mapping circuit.

An advantage of a preferred embodiment of the present invention is having an envelope tracking modulator capable of dynamically adjusting its control loop parameters based upon different operation conditions. As a result, the envelope tracking modulator may stabilize the control loop without costing performance degradation. Furthermore, the envelope tracking modulator may have an improved input-to-output frequency response under different loading conditions. Such an improved input-to-output response helps the power amplifier achieve better overall system performance such as higher efficiency and/or the like.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely dynamically adjusting control loop parameters for an envelope tracking amplifier. The invention may also be applied, however, to a variety of power amplifiers. Hereinafter, various embodiments will be explained in detail with reference to the accompanying drawings.

Figure 1:
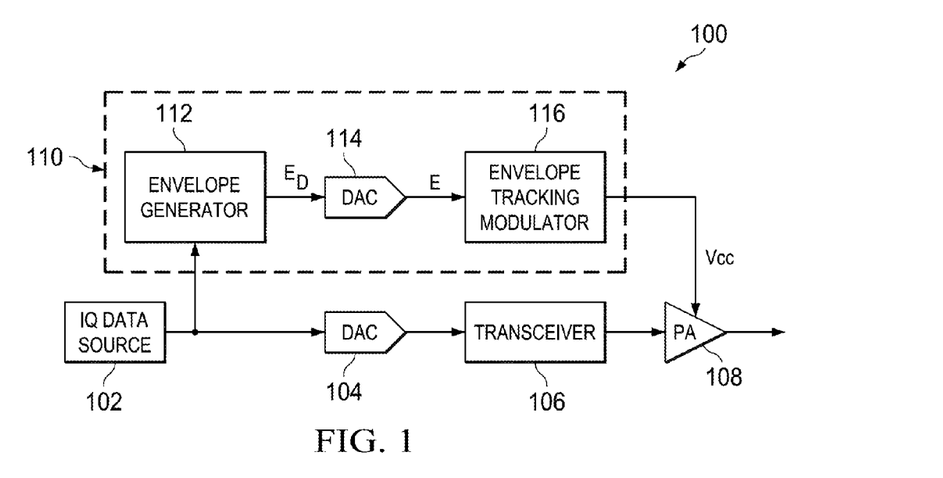
FIG. 1 illustrates a block diagram of an envelope tracking amplifier system in accordance with various embodiments of the present disclosure.

FIG. 1 illustrates a block diagram of an envelope tracking amplifier system in accordance with various embodiments of the present disclosure. The envelope tracking amplifier system 100 includes an in-phase and quadrature signal generator 102, a first digital-to-analog converter 104, a transceiver 106 and a power amplifier 108. As shown in FIG. 1, the in-phase and quadrature signal generator 102, the first digital-to-analog converter 104, the transceiver 106 and the power amplifier 108 are connected in cascade.

The envelope tracking amplifier system 100 further comprises an envelope tracking apparatus 110 formed by an envelope generation unit 112, a second digital-to-analog converter 114 and an envelope tracking modulator 116. As shown in FIG. 1, the envelope tracking apparatus 110 is coupled between the in-phase and quadrature signal generator 102 and the power amplifier 108. More particularly, the envelope tracking apparatus 110 receives an input signal from the in-phase and quadrature signal generator 102 and generates a control signal (e.g., $E_D$ in digital form and E in analog form), which is used to control the operation of the envelope tracking modulator 116 so as to further control the bias voltage Vcc applied to the power amplifier 108.

In some embodiments, the in-phase and quadrature signal generator 102 may be implemented as a constellation plot. A digital signal generated by a baseband processor (not shown) may be mapped onto the constellation plot through which the digital signal is converted into an in-phase signal and a quadrature signal.

The first digital-to-analog converter 104 is employed to convert the in-phase signal and the quadrature signal to their corresponding analog signals. The operation principles of a digital-to-analog converter are well known, and hence are not discussed herein in further detail to avoid unnecessary repetition.

The transceiver 106 is employed to convert the in-phase signal and the quadrature signal to their corresponding signals with a RF carrier frequency. Furthermore, the in-phase signal and the quadrature signal are summed together in the transceiver 106. The resulting signal generated by the transceiver 106 is sent to the power amplifier 108.

The power amplifier 108 is able to amplify the output signal generated by the transceiver 106 to a signal suitable for transmission form an antenna (not shown). The operation principle of a power amplifier for RF applications are well known, hence is not discussed herein to avoid repetition.

The envelope generation unit 112 may receive the same in-phase and quadrature signals as the first digital-to-analog converter 104. The envelope generation unit 112 may extract an envelope from the received in-phase and quadrature signals. The envelope of the received in-phase and quadrature signals may be generated through suitable envelope generation algorithms. In some embodiments, the envelope of the received in-phase and quadrature signals may be given by the following equation:

$$E_D = K \cdot \sqrt{I^2 + Q^2} \qquad (1)$$

where I is the amplitude of the in-phase signal and Q is the amplitude of the quadrature signal. K is a coefficient, which may be obtained through a predetermined lookup table.

In some embodiments, $E_D$ is a digital signal, which may be converted into a corresponding analog signal E through the second digital-to-analog converter 114. As shown in FIG. 1, the envelope signal E is fed to the envelope tracking modulator 116. In some embodiments, the envelope tracking modulator 116 may be implemented as a switching regulator. Such a switching regulator is able to adjust its output voltage based upon the envelope signal E. In some embodiments, the switching regulator may be alternatively referred to as an adaptive power supply. The detailed schematic diagram of an exemplary switching regulator will be described below with respect to FIG. 3.

In some embodiments, the bias voltage Vcc of the power amplifier 108 is proportional to the power losses of the power amplifier 108. However, the bias voltage cannot provide a linear operation of the power amplifier 108 if the bias voltage is lower than the envelope of the signal processed by the power amplifier 108. In order to achieve a high efficiency power amplifier, it is desirable that the output of the envelope tracking modulator 116 is modulated so that the output voltage is identical to the target signal E, which is generated based on the envelope of the quadrature signals (e.g., the in-phase signal I and the quadrature signal Q).

Figure 2:
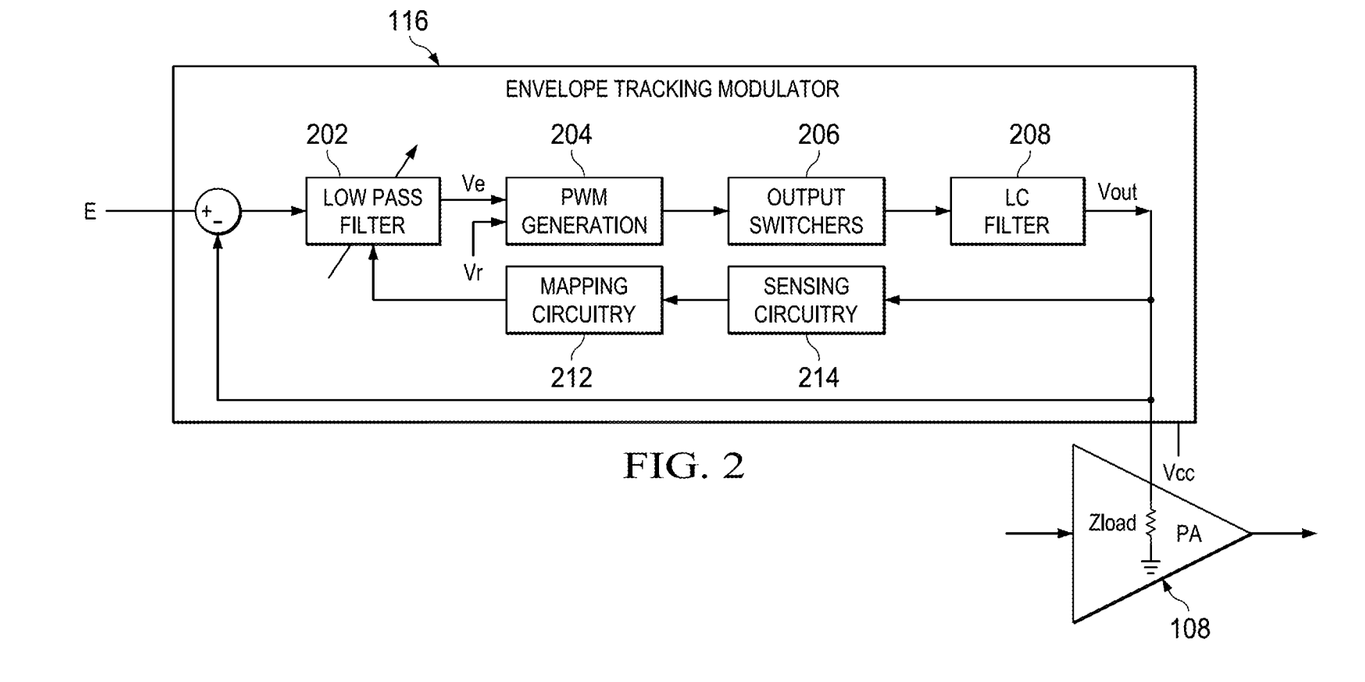
FIG. 2 illustrates a block diagram of the envelope tracking modulator shown in FIG. 1 in accordance with various embodiments of the present disclosure.

FIG. 2 illustrates a block diagram of the envelope tracking modulator shown in FIG. 1 in accordance with various embodiments of the present disclosure. The envelope tracking modulator 116 may comprise a low pass filter 202, a pulse width modulation (PWM) generator 204, a switching network 206 and an L-C filter 208. The low pass filter 201, the PWM generator 204, the switching network 206 and the L-C filter 208 are connected in cascade as shown in FIG. 2.

In some embodiments, the switching network 206 and the L-C filter 208 form a power converter having an adjustable output voltage Vcc. The PWM generator 204 is employed to generate gate drive signals for the switching network 206. As shown in FIG. 2, the PWM generator 204 receives two control signals, namely a saw-tooth signal Vr and an error signal Ve. The saw-tooth signal Vr may be generated by an independent signal generator (not shown). The error signal Ve is generated by the low pass filter 202.

The envelope tracking module 116 further comprises a feedback loop. The feedback loop may further comprise an outer loop and an inner loop as shown in FIG. 2. The outer loop is employed to regulate the bias voltage Vcc of the power amplifier 108. More particularly, the detected bias voltage is compared against the envelope signal E and the resulting error is used to adjust the duty cycle of the PWM signal generated by the PWM generator 204. In other words, the outer loop is employed to ensure the output voltage Vcc of the envelope tracking module 116 is approximately a replica of the envelope signal E.

In some embodiments, there may be a desired frequency response from the envelope signal E to the output voltage Vcc so that the envelope signal E can pass through the envelope tracking module 116 with minimum distortion. When the input of the power amplifier 108 is very low, the power amplifier 108 may draw a small amount of current, which normally means the equivalent impedance Zload is very large. On the other hand, when the input of the power amplifier 108 is very high, the power amplifier 108 may draw a large amount of current, which normally means the equivalent impedance Zload is very small.

As shown in FIG. 2, the equivalent impedance Zload is part of the feedback loop. This means the variation of the equivalent impedance Zload may have an impact on the input-to-output response. For the example, the power amplifier 108 may be of a normal impedance level under normal operation. When the equivalent impedance Zload is smaller than the normal impedance level, the frequency response is over damped, which means only low frequency portion of the envelope signal E will show up at the output of the envelope tracking module 116, thus degrades the performance. On the other hand, when the equivalent impedance Zload is larger than the normal impedance level, the frequency response is under damped, which means the high frequency content of the envelope signal E is amplified too much and often leads to instability. In sum, it is desirable to dynamically adjust the parameters of the control loop in response to different equivalent impedance Zload levels.

The inner loop is employed to dynamically adjust the parameters of the control loop. More particularly, the inner loop may adjust the parameters of the low pass filter 202 based upon different loading conditions. As shown in FIG. 2, the inner loop is formed by sensing circuitry 214 and mapping circuitry 212. In order to improve the stability of the envelope tracking module 116, the bias voltage Vcc as well as the current flowing into the power amplifier 108 are detected and sent to mapping circuitry 212. More particularly, the instantaneous current and the instantaneous bias voltage Vcc of the power amplifier 108 are sensed through the sensing circuitry 214. The instantaneous impedance Zload may be estimated based upon the sensed instantaneous current and voltage.

Based upon the detected current and voltage as well as the equivalent impedance Zload, the mapping circuitry 212 may adjust the parameters of the low pass filter 202 accordingly. The adjustment of the parameters of the low pass filter 202 leads to a different allocation of zeros/poles of the envelope tracking module 116. Such a different allocation helps to stabilize the envelope tracking module 116. The detailed implementation of how to allocate zeros/poles will be described below with respect to FIGS. 4-5.

One advantageous feature of having the inner loop described above is that the inner loop helps to improve the input-to-output response of the envelope tracking module 116. The load of the envelope tracking module 116 is the equivalent impedance Zload of the power amplifier 108 seen by a power supply (e.g., the output of the envelope tracking module 116). The equivalent impedance of the power amplifier 108 is highly non-linear. Without the inner loop, such a non-linear load may cause an unstable control loop as well as an undesirable input-to-output response.

By employing the inner loop, the parameters of the control loop may be dynamically adjusted based upon different loading conditions. As a result, the envelope tracking modulator 116 may have an improved input-to-output frequency response under different loading conditions. Such an improved input-to-output frequency response helps the power amplifier 108 achieve higher efficiency.

In sum, since the envelope tracking module 116 is capable of dynamically adjusting the parameters of the control loop under different load conditions, the envelope tracking module 116 may achieve better overall system performance such as higher efficiency and/or the like.

Figure 3:
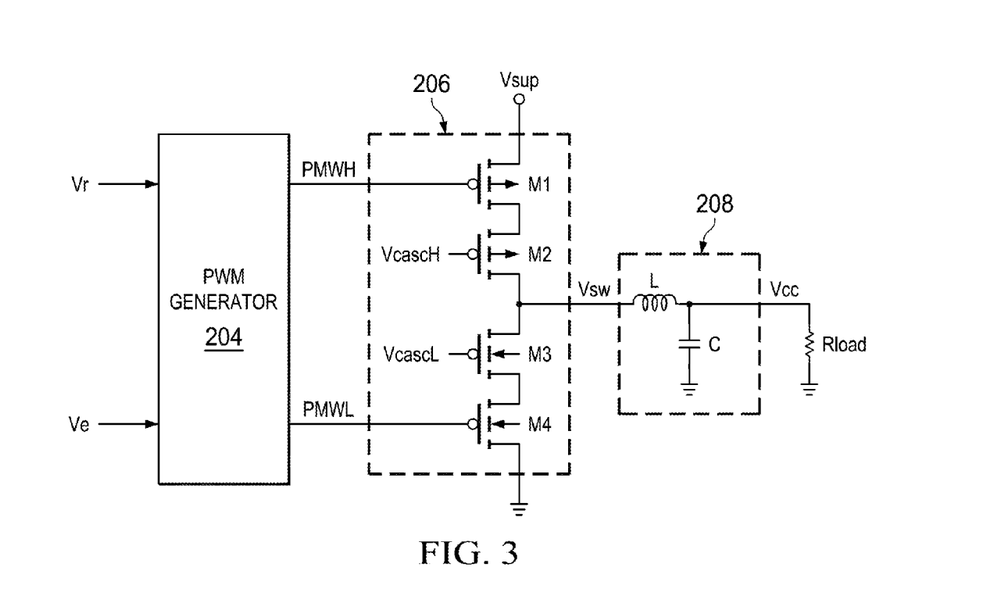
FIG. 3 illustrates a schematic diagram of the switching network in accordance with various embodiments of the present disclosure.

FIG. 3 illustrates a schematic diagram of the switching network in accordance with various embodiments of the present disclosure. As shown in FIG. 3, the switching network 206 is coupled to the L-C filter 208. In some embodiments, the L-C filter 208 may be formed by two L-C filters connected in series. As shown in FIG. 3, each filter is formed by an inductor and a capacitor. The L-C filter 208 is coupled between the switching network 206 and a load resistor. The L-C filter 208 helps to filter the PWM voltage (voltage at the common node of switches M2 and M3) to obtain a noise-free waveform at the output of the L-C filter 208.

It should be noted that FIG. 3 illustrates only one L-C filter. One of ordinary skill in the art would recognize many variations, alternatives, and modifications. For example, there may be a plurality of L-C filters connected in cascade. The number of L-C filters illustrated herein is limited solely for the purpose of clearly illustrating the inventive aspects of the various embodiments. The present invention is not limited to any specific number of L-C filters.

The switching network 206 comprises four switches M1, M2, M3 and M4 connected in series between a power supply Vsup and ground. In some embodiments, switches M1 and M4 may be implemented as a thin-oxide (a.k.a. low voltage) transistor. The low voltage transistor is chosen for achieving a high switching frequency with low power consumption. Switches M2 and M3 may be implemented as a thick-oxide (a.k.a. high voltage) transistor. The high voltage transistor is chosen for allowing operation of the switches at a voltage level higher than the maximum voltage rating of the low voltage transistors (e.g., M1 and M4).

The common node of switches M2 and M3 is coupled to the input of the L-C filter 208. The on/off of switches M2 and M3 are controlled by VcascH and VcascL respectively as shown in FIG. 3. In normal operation, the gates of switches M2 and M3 are held at constant potentials. In other words, both switch M2 and switch M3 are turned on. The output voltage Vcc is adjustable through adjusting the duty cycle of the PWM signals PWMH and PWML, which are coupled to the gates of M1 and M4 respectively.

As shown in FIG. 3, PWMH and PWML are generated by the PWM generator 204 and used for controlling the on/off of the switches M1 and M4. In some embodiments, the PWM generator 204 receives an error signal Ve and a ramp signal Vr. The error signal may be generated by an error amplifier (not shown) through comparing the detected output voltage Vcc against an envelope signal E (illustrated in FIG. 2). The ramp signal Vr is a voltage ramp having fixed amplitude. The ramp signal may be generated by a signal generator (not shown) using an internal clock.

In some embodiments, the internal clock sets a latch to initiate a drive cycle such as turning on switch M1. The error amplifier compares the detected output voltage against the envelope signal E and generates the error signal Ve. When the error signal Ve intersects the voltage ramp Vr, the latch is reset and the switch (e.g., switch M1) is turned off. In normal operation, when the input of the power amplifier varies, the envelop signal E may change accordingly. The variation of the envelope signal E may result in a change in the error signal Ve relative to the voltage ramp Vr. Such a change may lead to a change of the duty cycle of the PWM signals (e.g., PWMH) to force the output voltage Vcc in a shape substantially similar to that of the envelop signal E.

It should be noted that the switching network 206 shown in FIG. 3 is simply one manner of forming a power supply and that other and alternate embodiment power supplies could be employed (such as employing a different number of upper leg switches and bottom leg switches) and that other circuits, (e.g., a linear regulator, a charge pump regulator, etc.) could be employed for this function.

Figure 4:
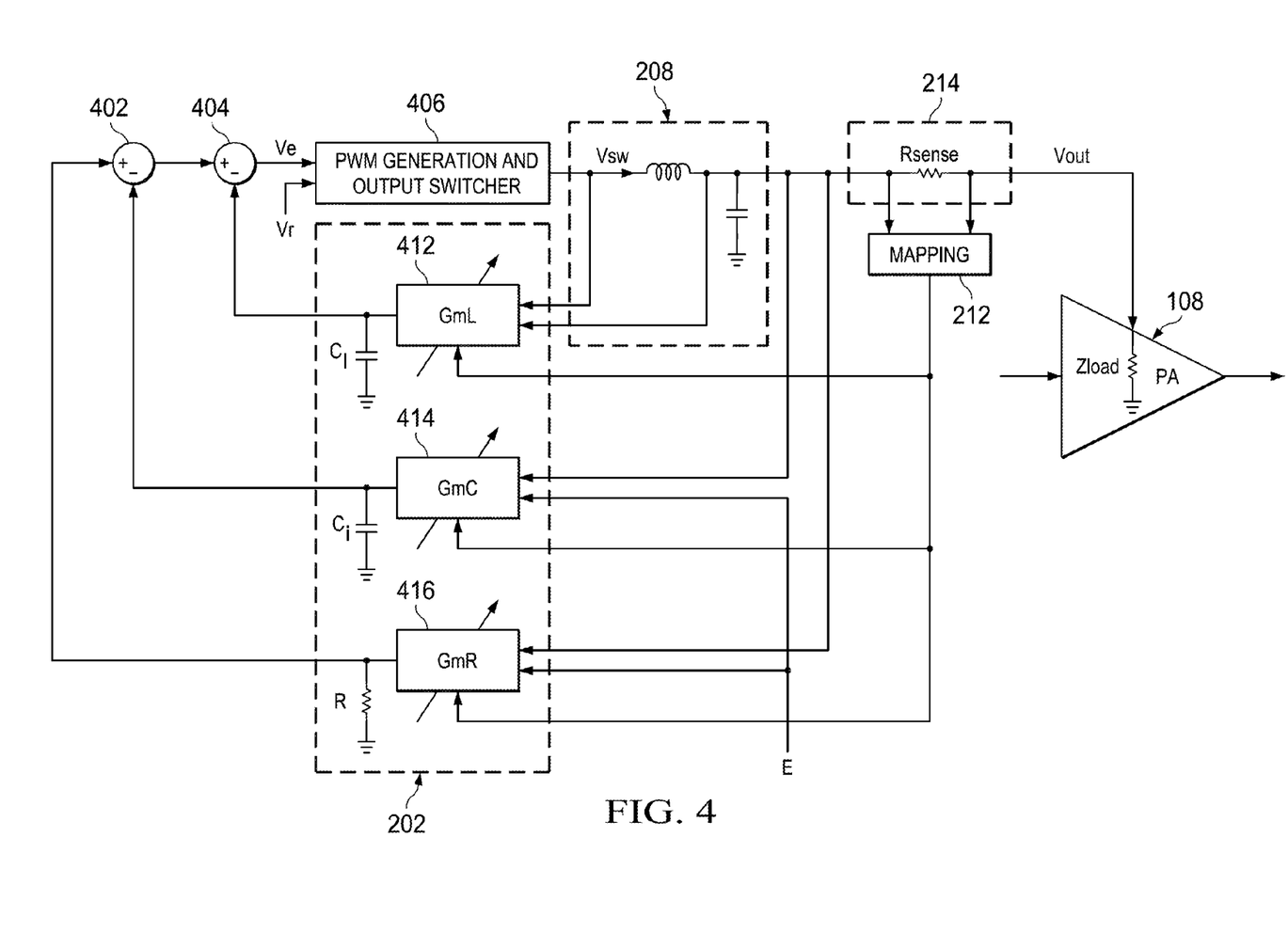
FIG. 4 illustrates a schematic diagram of the envelope tracking modulator in accordance with various embodiments of the present disclosure.

FIG. 4 illustrates a schematic diagram of the envelope tracking modulator in accordance with various embodiments of the present disclosure. As shown in FIG. 4, the sensing circuitry 214 is implemented as a sensing resistor coupled between the output of the L-C filter 208 and the bias voltage port of the power amplifier 108. The sensing circuitry 214 is employed to sense the load current and the output voltage in real time.

The mapping circuitry 212 is coupled between the sensing circuitry 214 and the low pass filter 202. The sensed load current and output voltage are sent to the mapping circuitry 212 in which the current and output voltage are mapped to control signals based upon the characteristics of the power amplifier 108. The control signals generated by the mapping circuitry 212 are used to adjust the parameters of the low pass filter 202 so as to cancel out the impact of the load variation of the power amplifier 108.

It should be noted that the characteristics of the power amplifier 108 may be determined through suitable processes such as a factory calibration process, a characterization process and/or the like.

As shown in FIG. 4, the low pass filter 202 is formed by three adjustable gain amplifiers. A first adjustable gain amplifier 412 may provide a zero for the control loop of the envelope tracking modulator 116. The transfer function of the first adjustable gain amplifier 412 is given by the following equation:

$$A1(S) = \frac{gm_l}{c_l \cdot S} \quad (2)$$

wherein $C_1$ represents the output capacitance of the first adjustable gain amplifier 412 and $gm_1$ is the gain of the first adjustable gain amplifier 412.

A second adjustable gain amplifier 414 may provide a zero for the control loop of the envelope tracking modulator 116. The transfer function of the second adjustable gain amplifier 414 is given by the following equation:

$$A2(S) = \frac{gm_c}{c_i \cdot S} \quad (3)$$

wherein $C_i$ represents the output capacitance of the second adjustable gain amplifier 414 and $gm_c$ is the gain of the second adjustable gain amplifier 414.

A third adjustable gain amplifier 416 may provide a gain, which is proportion to the present error of the envelope tracking modulator 116. The transfer function of the third adjustable gain amplifier 416 is given by the following equation:

$$A3(S) = gm_R \cdot R \quad (4)$$

wherein R represents the output load resistance of the third adjustable gain amplifier 416 and $gm_R$ is the gain of the third adjustable gain amplifier 416.

FIG. 4 further illustrates a first addition and subtraction unit 402 and a second addition and subtraction unit 404. As shown in FIG. 4, the first addition and subtraction unit 402 has a positive input coupled to an output of the third adjustable gain amplifier 416 and a negative input coupled to an output of the second adjustable gain amplifier 414. The second addition and subtraction unit 404 has a positive input coupled to an output of the first addition and subtraction unit 402 and a negative input coupled to an output of the first adjustable gain amplifier 412. The output of the second addition and subtraction unit 404 is the error voltage Ve, which is compared against the voltage ramp Vr at the PWM generator 406 as shown in FIG. 4.

The L-C filter 208 comprises an output inductor and an output capacitor. The load of the envelope tracking modulator 116 is the impedance looking into the power amplifier 108, which is referred to as Zload as shown in FIG. 4. The impedance Zload of the power amplifier 108 may vary depending on different loading conditions. By sensing the current and the bias voltage of the power amplifier 108, the control loop may estimate the value of the impedance Zload and dynamically adjust the parameters (e.g., the gain) of the adjustable gain amplifiers 412, 414 and 416 so as to achieve a desirable second order response. The detailed process of adjusting the parameters of the adjustable gain amplifiers 412, 414 and 416 will be described below with respect to FIG. 5.

Figure 5:
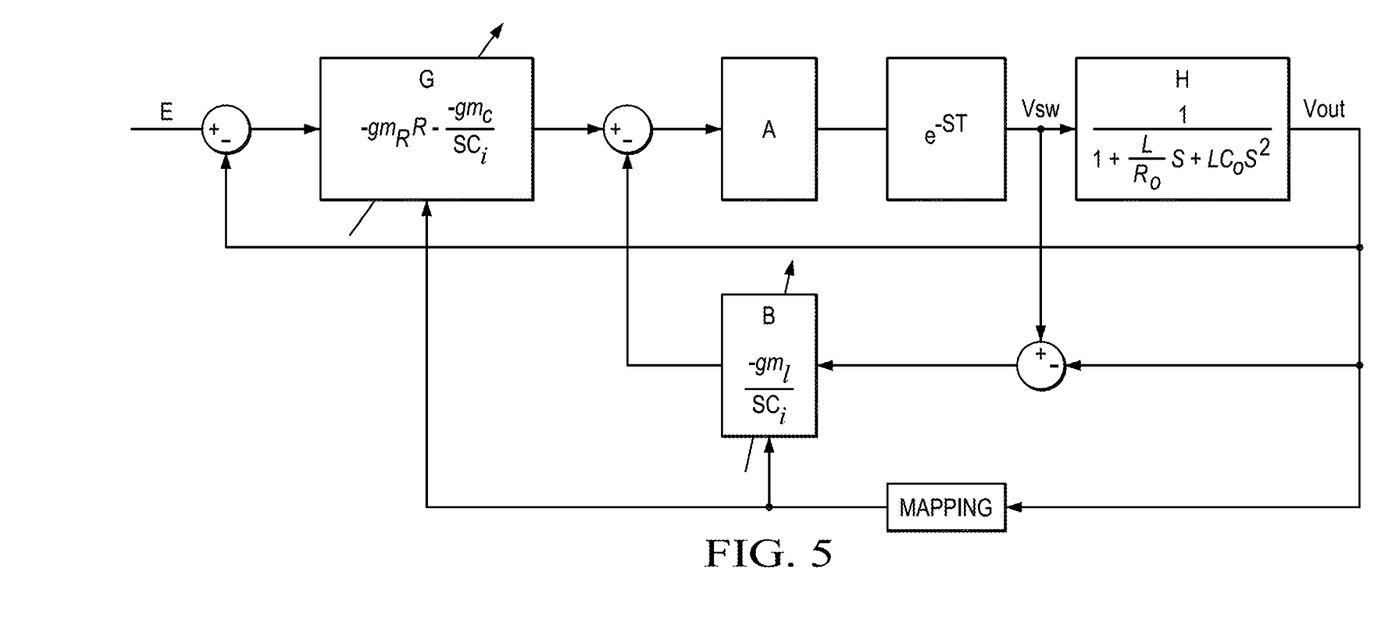
FIG. 5 illustrates an s-domain block diagram of the control system of the amplifier system in accordance with various embodiments of the present disclosure.

FIG. 5 illustrates an s-domain block diagram of the control system of the amplifier system in accordance with various embodiments of the present disclosure. In the s-domain block diagram shown in FIG. 5, there may be one inner feedback loop and two outer feedback loops. In a first outer loop, the output voltage is fed to the low pass filter through a mapping block. In a second outer feedback loop, the output voltage is subtracted from the envelope signal E and the resulting difference between the envelope voltage E and output voltage is fed to the low pass filter as shown in FIG. 5.

In an inner feedback loop, the output voltage is subtracted from the switching voltage and the resulting difference is fed to the B block. As shown in FIG. 5, the B block receives the difference signal as well as the output of the mapping block and generates a signal, which is subtracted from the output of the G block. The difference between the output of the G block and the output of the B block is fed to a PWM generator (e.g., the A block shown in FIG. 5) and a delay stage, wherein the delay stage represents the delay in the PWM generator. The output of the delay stage is fed to an LC network H as shown in FIG. 5.

In order to obtain the close-loop transfer equation of the amplifier system, the gain of the A block and the delay of the delay block are defined as follows:

$$A = 1 \quad (5)$$

$$e^{-ST} = 1 \quad (6)$$

In some embodiments, the H block represents the L-C filter and the load impedance. The H block is a second order system. The transfer equation of the H block may be expressed as:

$$H = \frac{1}{1 + h1 \cdot S + h2 \cdot S^2} \quad (7)$$

Since the H block represents the L-C filter and the load impedance, h1 and h2 in equation (7) may be given by the following equation:

$$h1 = \frac{L}{R_o} \quad (8)$$

$$h2 = L \cdot C_o \quad (9)$$

In some embodiments, the target close loop response of the amplifier system may be given by the following equation:

$$\frac{V_{out}}{E} = D = \frac{1}{1 + d1 \cdot S + d2 \cdot S^2} \quad (10)$$

In some embodiments, the transfer function of the B block may be given by the following equations:

$$B = \frac{c}{S} \quad (11)$$

$$c = \frac{gm_l}{c_l} \quad (12)$$

In some embodiments, the transfer function of the G block may be given by the following equations:

$$G = a + \frac{b}{S} \quad (13)$$

$$a = gm_R \cdot R \quad (14)$$

$$b = \frac{gm_c}{c_i} \quad (15)$$

The target control-loop transfer function may be equal to the close-loop transfer function. Such a relationship can be achieved if the following condition is satisfied:

$$a = \frac{h2}{d2} \quad (16)$$

$$b = \frac{h1^2 - a \cdot h2 - h2 - a \cdot d1 \cdot h1 + a \cdot d0 \cdot h2}{d2 \cdot h1 - d1 \cdot h2} \quad (17)$$

$$c = \frac{a \cdot d1^2 - a \cdot d0 \cdot d2 - h1 \cdot d1 + a \cdot d2 + d2}{d2 \cdot h1 - d1 \cdot h2 \cdot d1 - h1 \cdot d2 \cdot h2} \quad (18)$$

Equations (16), (17) and (18) show the mapping relationship between a, b and c, and the load impedance R. In other words, once the load impedance R is available, the target close loop transfer function may be derived by calculating a, b and c through equations 16-18.

Referring back to FIG. 4, a is the gain of the third adjustable gain amplifier 416; b is the gain of the second adjustable gain amplifier 414; c is the gain of the first adjustable gain amplifier 412. As described above, a, b and c can be derived from equations 16-18. The parameters of the low pass filter 202 may be dynamically adjusted accordingly.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
an amplifier having an input coupled to a radio frequency signal through a digital-to-analog circuit;
an adaptive power supply having an output coupled to a bias voltage of the amplifier, wherein the output of the adaptive power supply is configured to have a shape similar to an envelope of the radio frequency signal; and
a feedback circuit comprising a sensing circuit and a mapping circuit, wherein the sensing circuit is configured to:
sense a current flowing from the adaptive power supply to the amplifier; and
sense the bias voltage of the amplifier, and wherein the mapping circuit is configured to generate a control signal for dynamically adjusting parameters of a low pass filter so as to stabilize the adaptive power supply.

2. The apparatus of claim 1, wherein:
the sensing circuit and the mapping circuit are connected in cascade.

3. The apparatus of claim 1, wherein:
the adaptive power supply comprises the low pass filter, a PWM generator, a switching network and an output filter.

4. The apparatus of claim 3, wherein:
the switching network comprises four switches connected in series between a fixed dc source and ground, wherein the four switches are controlled such that an output voltage of the adaptive power supply tracks the envelope of the radio frequency signal.

5. The apparatus of claim 3, wherein the low pass filter comprises:
a first adjustable operation amplifier configured to provide a first adjustable zero for a control loop of the adaptive power supply;
a second adjustable operation amplifier configured to provide a second adjustable zero for the control loop of the adaptive power supply; and
a third adjustable operation amplifier configured to provide an adjustable gain for the control loop of the adaptive power supply.

6. The apparatus of claim 3, wherein:
the PWM generator having an input configured to receive a control signal tracking the envelope of the radio frequency signal and generate an output signal coupled to the switching network.

7. A system comprising:
an in-phase and quadrature signal generator configured to generate an in-phase signal and a quadrature signal;
a first digital-to-analog converter having an input coupled to an output of the in-phase and quadrature signal generator;
an envelope generator having an input coupled the output of the in-phase and quadrature signal generator;
a second digital-to-analog converter having an input coupled to an output of the envelope generator;
an envelope tracking modulator having an input coupled to an output of the second digital-to-analog converter; and
an amplifier having an input coupled to an output of the first digital-to-analog converter and a bias voltage input coupled to an output of the envelope tracking modulator, wherein the envelope tracking modulator comprises:
an adaptive power supply having an output coupled to the bias voltage input of the amplifier, wherein the output of the adaptive power supply is configured to have a shape similar to an envelope of the in-phase signal and the quadrature signal; and
a feedback circuit comprising a sensing circuit and a mapping circuit, wherein the sensing circuit is configured to:
sense a current flowing from the adaptive power to the amplifier; and
sense the bias voltage of the amplifier; and wherein the mapping circuit is configured to adjust parameters of a low pass filter so as to stabilize the adaptive power supply.

8. The system of claim 7, further comprising:
a transceiver coupled between the amplifier and the first digital-to-analog converter.

9. The system of claim 7, wherein:
the envelope tracking modulator comprises the low pass filter, a PWM generator, a switching network and an output filter.

10. The system of claim 9, wherein:
the low pass filter, the PWM generator, the switching network and the output filter are connected in cascade.

11. The system of claim 10, wherein:
the PWM generator having a first input coupled to a ramp generator and a second input coupled to an output of the low pass filter.

12. The system of claim 11, wherein the low pass filter comprises:
a first adjustable operation amplifier configured to provide a first adjustable zero for a control loop of the adaptive power supply;
a second adjustable operation amplifier configured to provide a second adjustable zero for the control loop of the adaptive power supply; and
a third adjustable operation amplifier configured to provide an adjustable gain for the control loop of the adaptive power supply.

13. The system of claim 12, further comprising:
a first addition and subtraction unit having a positive input coupled to an output of the third adjustable operation amplifier and a negative input coupled to an output of the second adjustable operation amplifier; and
a second addition and subtraction unit having a positive input coupled to an output of the first addition and subtraction unit and a negative input coupled to an output of the first adjustable operation amplifier.

14. The system of claim 13, wherein:
an output of the second addition and subtraction unit is coupled to the second input of the PWM generator.

15. A method comprising:
providing a radio frequency signal to an amplifier, wherein the amplifier has a bias voltage input coupled to an output of an adaptive power supply;
extracting an envelope of the radio frequency through an envelope generator;
configuring the adaptive power supply such that the output of the adaptive power supply has a shape similar to the envelope of the radio frequency signal; and
adjusting parameters of a low pass filter based upon detected current and voltage signals of the amplifier through a feedback circuit comprising a sensing circuit and a mapping circuit.

16. The method of claim 15, further comprising:
sensing a current flowing from the adaptive power to the amplifier; and
sensing the bias voltage of the amplifier, wherein the mapping circuit is configured to generate a control signal for dynamically adjusting the parameters of the low pass filter so as to stabilize the adaptive power supply.

17. The method of claim 15, wherein the low filter comprises:
a first adjustable operation amplifier configured to provide a first adjustable zero for a control loop of the adaptive power supply;
a second adjustable operation amplifier configured to provide a second adjustable zero for the control loop of the adaptive power supply; and
a third adjustable operation amplifier configured to provide an adjustable gain for the control loop of the adaptive power supply.

18. The method of claim 17, wherein:
adjusting a gain of the first adjustable operation amplifier based upon the detected current and voltage signals of the amplifier;
adjusting a gain of the second adjustable operation amplifier based upon the detected current and voltage signals of the amplifier; and
adjusting a gain of the third adjustable operation amplifier based upon the detected current and voltage signals of the amplifier.

19. The method of claim 17, further comprising:
subtracting an output of the third adjustable operation amplifier from an output of the second adjustable operation amplifier through a first add/subtract unit; and
subtracting an output of the third adjustable operation amplifier from an output of the second adjustable operation amplifier through a second add/subtract unit.

20. The method of claim 19, wherein:
generating a PWM signal based upon a comparison between an output signal of the second add/subtract unit and a saw-tooth signal.

\* \* \* \* \*